United States Patent [19]

Sirkin et al.

[11] Patent Number: 5,405,733
[45] Date of Patent: Apr. 11, 1995

[54] MULTIPLE BEAM LASER EXPOSURE SYSTEM FOR LIQUID CRYSTAL SHUTTERS

[75] Inventors: Eric R. Sirkin, Palo Alto; Joseph J. Curry, Los Altos, both of Calif.

[73] Assignee: Apple Computer, Inc., Cupertino, Calif.

[21] Appl. No.: 151,571

[22] Filed: Nov. 12, 1993

Related U.S. Application Data

[63] Continuation of Ser. No. 881,990, May 12, 1992.

[51] Int. Cl.$^6$ .............................................. G03C 5/04
[52] U.S. Cl. ........................... 430/313; 430/319; 430/397
[58] Field of Search ............ 430/313, 318, 319, 320, 430/396, 397

[56] References Cited

U.S. PATENT DOCUMENTS

| | | | |
|---|---|---|---|
| 3,148,085 | 9/1964 | Wiegmann | 430/397 |
| 4,021,239 | 5/1977 | Ogawa | 430/397 |
| 4,032,343 | 6/1977 | Deml | 430/397 |

FOREIGN PATENT DOCUMENTS 81003618 12/1975 Japan .................................. 430/397

*Primary Examiner*—Kathleen Duda
*Attorney, Agent, or Firm*—Blakely, Sokoloff, Taylor & Zafman

[57] ABSTRACT

A method for fabricating liquid crystal shutters using a laser exposure system. An output beam from the laser is split into multiple exposure beams and a photoresist coated substrate having a metallic layer is caused to traverse the beams. The substrate is then processed leaving multiple parallel electrodes on the substrate surface.

11 Claims, 1 Drawing Sheet

MULTIPLE BEAM LASER EXPOSURE SYSTEM FOR LIQUID CRYSTAL SHUTTERS

This is a continuation of application Ser. No. 07/881,990, filed May 12, 1992.

BACKGROUND OF THE INVENTION

1. Field of the Invention

The present invention relates generally to liquid crystal shutters and more particularly to a method for fabricating liquid crystal shutter displays using a single mode visible laser.

2. Brief Description of Related Art

The fabrication of liquid crystal shutter display devices requires the delineation of multiple parallel horizontal segments of indium tin oxide, separated by narrow spaces, on the surface of a sheet glass substrate. The narrow spaces are typically in the order of 4-10 microns wide and provide electrical isolation of the stripes to facilitate synchronization of the switching of the liquid crystal with the vertical raster of a CRT.

Typical contemporary production techniques in the liquid crystal display industry employ positive working photoresists for reproducing the image of a photomask on the surface of the glass substrate. Briefly, to produce the above-described parallel segments, a glass substrate having a thin indium tin oxide conductive layer on its surface is coated with photoresist. A photomask with the appropriate segment-spacing pattern is brought within close proximity to the photoresist coating and a UV lamp behind the photomask is illuminated. The light striking the photoresist causes a photochemical reaction that allows a developing solution to remove photoresist from all areas exposed to the UV light.

The achievable space dimensions between the segments, and their tolerances within the photoresist, are determined by the optical system used in the fabrication, including: the dimensions on the photomask; the spacing between the mask and substrate; and, the wavelength of the UV lamp. Current high volume exposure tools in the liquid crystal display industry are capable of resolving lines on the order of $\geq 20\mu$ at their best performance. Typical contemporary proximity aligners could be set up for small exposure gaps on the order of sub $10\mu$, but this would cause undo pick-up of photoresist particles off of the surface of the substrate and result in repeating defects unless the photomask was frequently cleaned.

An alternative exposure tool for producing the requisite spaces between the parallel segments is a step and repeat aligner. In a step and repeat aligner, a photomask is placed at a predetermined distance from the substrate and an optical system reduces the image of the photomask by some integer number (typically 2x to 5x) onto the surface of the substrate. The substrate is then moved by a stage and the exposure is repeated. In this fashion, exposure is achieved by stepping the substrate and repeating exposure, making sure that, each time, the mask is aligned properly to either the previously exposed layer, or to the adjacent layer. While such tools are capable of resolving the narrow lines needed for defining the horizontal segments in liquid crystal shutters, they suffer from high capital costs and low material throughput, making them unsuitable for lowest cost high volume manufacturing.

SUMMARY OF THE INVENTION

The present invention comprises a method for fabricating liquid crystal shutters using a single mode visible laser. The laser is used to produce a single beam, capable of being split into multiple beams, which is focused onto the surface of a photoresist coated glass substrate. The substrate includes a thin layer of indium tin oxide to provide conductive electrodes for the shutter.

In the preferred method, the substrate is moved via a translation stage across the laser beam path or paths such that a single narrow line or multiple narrow lines of photoresist are exposed. The photoresist is then developed and the indium tin oxide layer is etched from the substrate. After stripping the remaining photoresist from the substrate surface, well defined horizontal electrodes remain in the indium tin oxide with sufficient electrical isolation to ensure proper functioning of the shutter.

In bypassing the use of photomasks, the preferred method provides a low-cost, high throughput technique for exposing multiple lines in the indium tin oxide layer with minimal risk of picking up repeating defects. Additionally, once the beam splitters are positioned and fixed, the only moving part in the exposure system is the substrate transport mechanism. This provides for a very robust, relatively inexpensive system which is amenable to a high volume manufacturing environment.

DETAILED DESCRIPTION OF THE PREFERRED EMBODIMENT

Figure 1:
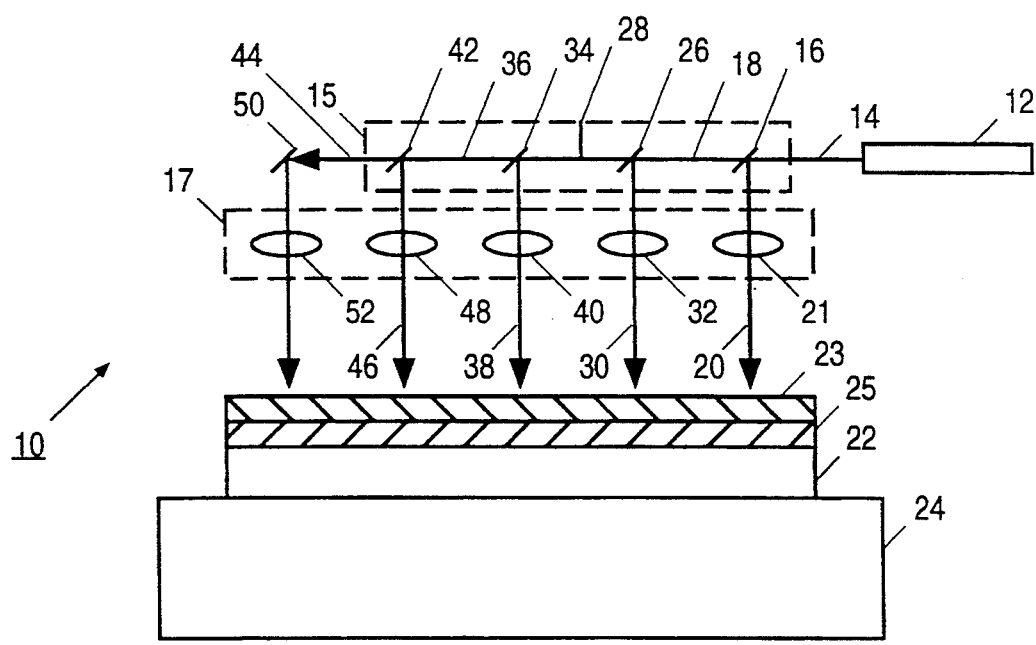
FIG. 1 is an elevational view of an exposure system and its interrelationship with the indium tin oxide coated glass substrate, illustrating the preferred method of the present invention.

Referring now to FIG. 1, shown is an exposure system 10 for fabricating a liquid crystal shutter in accordance with the preferred method of the present invention. A single mode visible laser 12 provides an unattenuated source beam of light 14 which can be used directly or split into several separate beams. In the embodiment depicted in FIG. 1, a beam splitting system 15 is provided to split source beam 14 into several separate component exposure beams, and a focusing system 17 is provided to focus the individual exposure beams onto a predetermined target, normally a prepared glass substrate 22. Glass substrate 22 includes an indium tin oxide electrode coating 25 and a photoresist coating 23, and is carried by a translation stage 24. The substrate is normally loaded onto translation stage 24 using an appropriate loading cassette type of mechanism well known to one skilled in the art.

Beam splitting system 15 comprises a first beam splitter 16, disposed in a first predetermined position within the system, and effectively splits source beam 14 into a first component beam 18, coaxial with the source beam, and a first exposure beam 20, substantially orthogonal to the source beam. A first focusing element 21 of focusing system 17 is disposed along the path of exposure beam 20 and focuses the beam onto photoresist layer 23 on substrate 22.

A second beam splitter 26 is provided at a second predetermined position within beam splitting system 15 and effectively splits first component beam 18 into a second component beam 28, coaxial with beam 18, and a second exposure beam 30, orthogonal to beam 18 and parallel to beam 20. The distance between beam splitter 26 and adjacent beam splitter 16 is normally determined by the requisite width of the adjacent horizontal segments to be formed within the indium tin oxide electrode coating 25 on substrate 22. Typically, the horizontal segments are approximately 15 mm wide which translates into a spacing of 15 mm between beam splitter 26 and beam splitter 16. As will be described in further detail below, each beam splitter is disposed a substantially equal distance from the adjacent beam splitters. A second focusing element 32 of focusing system 17 is disposed along the path of exposure beam 30 and focuses the beam onto photoresist layer 23.

A third beam splitter 34 is provided at a third predetermined position within beam splitting system 15 and effectively splits second component beam 28 into a third component beam 36, coaxial with beam 28, and a third exposure beam 38, orthogonal to beam 28 and parallel to beam 30. Beam splitter 34 is normally disposed an equal distance from beam splitter 26 as beam splitter 26 is from beam splitter 16. This distance, once again, is determined by the requisite spacing of the electrodes to be formed on substrate 22. A third focusing element 40 of focusing system 17 is disposed along the path of exposure beam 38 and focuses the beam onto photoresist layer 23.

In the embodiment of FIG. 1, a fourth and final beam splitter 42 is provided at a fourth predetermined position within beam splitting system 15 and effectively splits third component beam 36 into a fourth component beam 44, coaxial with beam 36, and a fourth exposure beam 46, orthogonal to beam 36 and parallel to beam 38. Beam splitter 42 is normally disposed an equal distance from beam splitter 34 as beam splitter 34 is from beam splitter 26. A fourth focusing element 48 of focusing system 17 is disposed along the path of exposure beam 46 and focuses the beam onto photoresist layer 23.

The final element along the optical path of source beam 14 is a 100% reflecting mirror 50 which completely reflects any incident light onto photoresist layer 23. Once again, mirror 50 is disposed at an equal distance from beam splitter 42 as beam splitter 42 is from beam splitter 34. Mirror 50 effectively reflects component beam 44 toward substrate 22 along a path parallel to exposure beam 46. A fifth focusing element 52 of focusing system 17 is disposed along the path of reflected beam 44 and focuses the beam onto photoresist layer 23.

As described above, the series of beam splitters act in concert to separate a single source beam from the laser into a number of exposure beams corresponding to the number of lines to be exposed in the photoresist coated substrate. For an N-segment shutter, N minus 1 exposure beams and N minus 2 beam splitters are required. The last element in the optical path of the source beam is a 100% reflecting mirror. The percent reflection vs. transmission of each beam splitter needs to be uniquely tailored to specific design requirements and product characteristics. More specifically, since each beam splitter removes a portion of the incident laser energy and transmits the balance, each splitter must be uniquely fabricated so that their reflection and transmission properties provide equal energy in each beam. A formula for determining the percentage reflection and the percentage transmission by each splitter is provided below for an N segment shutter and for the mth beam forming reflector:

| Reflecting Element # | % Reflection | % Transmission |
|---|---|---|
| 1 | [1/(N-1)]*100 | [1-1/(N-1)]*100 |
| 2 | [1/(N-2)]*100 | [1-1/(N-2)]*100 |
| 3 | [1/(N-3)]*100 | [1-1/(N-3)]*100 |
| . | . | . |
| . | . | . |
| m | [1/(N-m)]*100 | [1-1/(N-m)]*100 |
| . | . | . |
| . | . | . |
| N-2 | 50% | 50% |
| N-1 (mirror) | 100% | 0% |

The technology for fabricating beam splitter coatings with this range of reflection vs. transmission is well known to those skilled in the art.

During fabrication of a shutter in accordance with the method of the present invention, translation stage 24 moves substrate 22 within a fixed plane perpendicular to the direction of incidence of the exposure beams and in a direction normal to the plane of the page containing FIG. 1. The substrate is normally driven at a fixed velocity of approximately 1-5 cm/sec, depending upon the intensity of the incident exposure beams.

Focusing system 17 is configured to separately maintain the focus of each exposure beam on the photoresist layer. Each focusing element is designed such that the optics have a large depth of field and high numerical aperture, thus providing for a robust fabrication method which is less susceptible to any inadvertent tilt angle along the axis of the substrate. In a visible laser at 5320 Å a typical laser used in the present method, maintaining a focus of below $10\mu$ is relatively easy and is well known in the art.

Efficient use of the method of the present invention requires the ability to expose multiple lines using sufficient energies in the exposure beams to develop the photoresist. For sub 1 micron thick photoresist layers, most resists specify energies on the order of 80 to 120 mj/cm$^2$. He-Cd lasers are available which emit on the order of 50 mwatts of energy. For an N=8 segment shutter, 7 beams are required for complete exposure. For a substrate throughput of one per minute, it is necessary to move the translation stage at a rate of 1 to 2 cm/sec. Thus, in one second, the laser exposes approximately 7*2*10E−4=0.014 sq cm. At the top of the exposure range, with the less sensitive resists, the laser must provide 120*0.014=1.7 mwatts, which is more than an order of magnitude less than the laser actually produces. Even with some light losses, there is plenty of energy to deliver all the light needed to expose the lines in the time required.

After the substrate has completely traversed the line of exposure beams from end to end, the exposed photoresist is removed, and the indium tin oxide electrode is etched. The remaining photoresist is then stripped from the substrate surface, leaving a predetermined number of well defined parallel electrodes. In the embodiment depicted in FIG. 1, six electrodes are formed on substrate 22 using the five exposure beams.

Fabrication of a liquid crystal shutter in accordance with the method of the present invention realizes several significant advantages. The design and fabrication costs for the exposure system used in the present method are relatively inexpensive. The only substantive moving part is a single axis translation stage capable of maintaining a level surface and traversing the length of the glass substrate. Since all of the glass substrates have substantially the same patterns exposed, the positions of the beam splitters normally require no readjustment during fabrication. Additionally, there is no modulation or a need for changing the deflection of the laser beam. Thus, no special galvanic mirrors or acousto-optic cells are required. Finally, the alignment of the substrate requires no special registration technology other than mechanical pins for positioning the substrate within approximately 0.5 mm accuracy.

Of course, there are design alternatives that will be obvious to those skilled in the art after reading the above description of the preferred embodiment. For example, a single exposure beam could be employed to produce the spaces between parallel elements. The translation stage would then have to traverse the length of the substrate several times in order to expose the necessary lines in the photoresist. Additionally, the substrate could be held stationary, and the exposure system could be moved along the length of the substrate to produce the lines. It is intended that the appended claims be interpreted as covering all such alternatives and modifications as fall within the true spirit and scope of the invention.

What is claimed is:

1. A method for fabricating a liquid crystal shutter display device in which an electrode layer is bonded to a surface of a glass substrate and coated with a layer of photoresist, comprising the steps of:

providing a source light beam using a single mode visible laser;

splitting said source beam into a plurality of parallel exposure beams;

directing said parallel exposure beams onto said photoresist layer at predetermined spacing relative to one another;

affecting linear translation between said parallel exposure beams and said substrate such that parallel segments are defined in said photoresist layer by said parallel exposure beams;

developing said photoresist, then etching said electrode layer and stripping said photoresist to form parallel electrodes on said substrate.

2. The method of claim 1 wherein said step of affecting linear translation comprises the step of moving said substrate relative to said parallel exposure beams.

3. The method of claim 2 wherein said step of moving said substrate comprises the step of using a translation stage mechanism to move said substrate.

4. The method of claim 2 wherein said directing step includes the step of individually focusing each one of said exposure beams onto said photoresist layer.

5. The method of claim 4 wherein said individually focusing step comprises the step of using a plurality of individual lens systems such that each one of said lens systems focuses a respective one of said exposure beams substantially orthogonally to the surface of said substrate.

6. The method of claim 1 wherein said directing step includes the step of individually focusing each one of said exposure beams onto said photoresist layer.

7. The method of claim 6 wherein said individually focusing step comprises the step of using a plurality of individual lens systems such that each one of said lens systems focuses a respective one of said exposure beams onto said photoresist layer.

8. The method of claim 6 wherein said splitting step comprises the steps of:

splitting said source beam into a first one of said exposure beams and a first component beam, and splitting said first component beam to produce a second one of said exposure beams.

9. The method of claim 8 wherein said source beam splitting step comprises the step of reflecting a first percentage of said source beam as said first exposure beam; and wherein said first component beam splitting step comprises the step of reflecting a second percentage of said first component beam as said second exposure beam, wherein said second percentage is different from said first percentage.

10. The method of claim I wherein said splitting step comprises the steps of:

splitting said source beam into a first one of said exposure beams and a first component beam, and splitting said first component beam to produce a second one of said exposure beams.

11. The method of claim 10 wherein said source beam splitting step comprises the step of reflecting a first percentage of said source beam as said first exposure beam; and wherein said first component beam splitting step comprises the step of reflecting a second percentage of said first component beam as said second exposure beam, wherein said second percentage is different from said first percentage.

* * * * *